United States Patent [19]
Lin et al.

[11] Patent Number: 5,883,416
[45] Date of Patent: Mar. 16, 1999

[54] GATE-CONTACT STRUCTURE TO PREVENT CONTACT METAL PENETRATION THROUGH GATE LAYER WITHOUT AFFECTING BREAKDOWN VOLTAGE

[75] Inventors: True-Lon Lin, Cupertino; Koon Chong So, San Jose; Fwu-Iuan Hshieh, Saratoga; Yan Man Tsui, Union City, all of Calif.

[73] Assignee: MegaMOS Corporation, San Jose, Calif.

[21] Appl. No.: 792,226

[22] Filed: Jan. 31, 1997

[51] Int. Cl.$^6$ .......................... H01L 23/485; H01L 23/48
[52] U.S. Cl. .......................... 257/355; 257/758; 257/776; 257/784
[58] Field of Search .................. 257/341, 36 G, 257/784, 778, 355, 356, 362, 491, 496, 758, 759

[56] References Cited

U.S. PATENT DOCUMENTS

| | | | |
|---|---|---|---|
| 4,920,388 | 4/1990 | Blanchard et al. | 257/341 |
| 5,235,212 | 8/1993 | Shimizu et al. | 257/780 |
| 5,394,013 | 2/1995 | Oka et al. | 257/786 |
| 5,410,171 | 4/1995 | Tsuzuki et al. | 257/341 |
| 5,430,324 | 7/1995 | Bencuya | 257/495 |
| 5,521,409 | 5/1996 | Hshieh et al. | 257/341 |
| 5,592,006 | 1/1997 | Merrill | 257/337 |
| 5,648,670 | 7/1997 | Blanchard | 257/329 |
| 5,679,968 | 10/1997 | Smayling et al. | 257/368 |

*Primary Examiner*—Donald L. Monin, Jr.
*Attorney, Agent, or Firm*—Bo-In Lin

[57] ABSTRACT

The present invention discloses a power transistor disposed on a substrate. The power device includes a core cell area comprising a plurality of power transistor cells each having drain and a source. Each of the power transistor cells further having a polycrystalline silicon gate formed on the substrate as part of a polycrystalline silicon gate layer overlaying the substrate. The polycrystalline silicon gate layer includes a plurality of polycrystalline gate-layer-extension extending to gate contact areas for forming gate contacts with a contact metal disposed thereon. The power transistor further includes a plurality of contact-metal-resistant pad each includes a thick oxide pad disposed below the gate contact areas underneath the polycrystalline gate layer extension whereby the contact-metal resistant pads resists the contact metal from penetrating therethrough and short to the substrate disposed thereunder.

8 Claims, 9 Drawing Sheets

GATE-CONTACT STRUCTURE TO PREVENT CONTACT METAL PENETRATION THROUGH GATE LAYER WITHOUT AFFECTING BREAKDOWN VOLTAGE

BACKGROUND OF THE INVENTION

1. Field of the Invention

This invention relates generally to the structure and fabrication process of semiconductor transistors. More particularly, this invention relates to a novel and improved power transistor gate contact design and configuration in order to prevent the contact metal from penetrating the gate layer without adversely affecting the breakdown voltage in the gate runner whereby the reliability difficulties and product yield problems caused by contract metal penetration through the gate layer may be resolved.

2. Description of the Prior Art

The problem of gate-drain short and gate-source short in the gate contact areas, e.g., in a contact area on a polysilicon finger, for a power device is becoming more pronounced due to several factors. One of a most important reasons for this problem is the fact that the gate employed in the semiconductor power devices is becoming more and more heavily doped with ions such as arsenic, phosphorous, boron or $POCL_3$ dopants to achieve higher switching speed. However, more processing defects such as the etching pits are increased as the gate layer becomes more heavily doped. Additionally, since the thickness of the gate is decreased to increase the metal step coverage in the contact area, the contact metal formed above the polysilicon gate, i.e., "poly" gate, in entering to gate layer through these processing defects, has greater degree of likelihood that the contact metal may penetrate through this thin poly gate layer and a thin gate oxide layer underneath thus forming a short circuit connecting the contact to the substrate drain and the source underneath the gate layer. As the devices are further miniaturized and the gate layer is becoming thinner while the gate is ever heavier doped to improve device performance, this concern of contact metal penetration through gate has increasingly caused difficulties in product reliability and production yield.

In order to better understand the background of this invention, please refer to FIG. 1 which is a partial top view of the MOSFET device 10 with the active area 40 which includes core cell areas 42 and gate contact areas 44 as shown. There are a plurality of cells each includes source contact 30 surrounded by p-body 25 and the cells are arranged in a square-on-square configuration. The polysilicon gates are extended as "poly-fingers" 72 from the core cell area 40 outwardly to the gate contact area 44 with a gate runner 76 connected to these poly fingers 72 with a plurality of gate contacts, i.e., poly contact 70 formed thereon. There are no rigid rules governing the locations of the gate contacts 70. The MOSFET device 10 also includes field oxide area 50 opposite the active area 40 as will be further discussed below in FIG. 2A.

FIG. 2A shows a cross-sectional view along the lines of X–X' in FIG. 1 for the conventional N-channel MOSFET device 10. The MOSFET device 10 is supported on a $n^+$ substrate 15 with a $n^-$ doped epitaxial drain region 20 formed thereon. A plurality of p-body regions 25 and $n^+$ source regions 30 are formed on top of the drain region 20 as shown. The MOSFET device 10 is divided into an active area 40 which includes a core cell area 42 and a gate contact area 44. The MOSFET device 10 further includes a field oxide area 50. A plurality of cells which include the p-body 25, the source regions 30, and a polysilicon gate 35 are formed in the core cell area 42. As shown in FIG. 1, the source electrode (S) 60 is formed in the core cell area 42 and the gate runner (G) 76 and the gate contacts 70 are formed in the gate contact areas 44 in the active area 40 near the field oxide areas 50. The field plate (FP) 80 and the equal ring (EQR) 90 are formed in the filed oxide area 50 where the field oxide layer 52 is not removed in the manufacturing process.

Due to the fact that the polysilicon gate 35 is now more heavily doped, the contact metal deposited on top of the gate layer 35 tends to have higher possibility to penetrate through the polysilicon layer 35 due to more defects formed in a contact etch process in forming the contact openings above the gate layer to deposit the contact metal therein. The contact metals can easily enter into the small cracks on the gate layer 35. As the polysilicon gate 35 has a thickness of about half a micron or less while the gate oxide layer 39 underneath the gate layer 35 has a thickness ranging between 100 to 1000 Angstroms, the metal contacts, e.g., aluminum, often penetrates the gate layer 35 and the gate oxide layer 39 as that shown in FIG. 2B. A gate-to-drain and gate-to-source short circuits maybe formed due to such penetration and various performance characteristics are adversely affected when this short circuit occurs. The product reliability and production yield are therefore affected by this gate-metal penetrating through gate phenomenon.

In a conventional method of manufacturing the semiconductor device, the gate oxide 37 under the polysilicon gate 35 and the oxide layer 39 below the gate contact 70 underneath the polysilicon gate are formed as a single layer with uniform thickness. The manufacture process is simplified to form a gate oxide layer 37 and 39 over the entire area. However, as the device performance would generally be improved with a thinner gate oxide, the oxide layer 39 below the gate contact 70 is also made very thin just like the gate oxide 37 in the core cells. A person of ordinary skill in the art would generally apply this manufacture process for the very reason that the manufacture process is simpler and the penetration phenomenon of the contact metals through the gate 35 and the oxide layer 39 are not yet fully studied and the real cause of the problems associated with poor product reliability and product yield are still not clearly identified.

FIG. 2B is a scanning electronic microscopic (SEM) cross sectional picture of a conventional gate structure to clearly depict the root cause of the gate contact problems. The picture dear shows that the contact metal penetrates the gate layer and the gate oxide layer underneath. Without detail diagnostic test in a highly sophisticate laboratory to discover the penetration of the metal through the gate and the gate oxide, those of ordinary skill in the art in design and manufacturing the semiconductor device are still in search of the real cause of the technical difficulties. A solution to the problems associate with the penetration phenomenon cannot be defined yet because the real reasons lead to the problems are not yet determined.

Therefore, a need still exists in the art of power device fabrication, particularly for semiconductor power device design and fabrication, to provide an improved gate structure and fabrication process that would resolve these difficulties.

SUMMARY OF THE PRESENT INVENTION

It is therefore an object of the present invention to provide an improved gate contact structure manufactured by a novel process in order to overcome the aforementioned limitations and difficulties encountered in the prior art.

Specifically, it is an object of the present invention to provide an improved gate contact structure wherein a special contact metal resistant pads composed of thick oxide layer is formed below the gate contact underneath the polysilicon gates such that penetration of the gate metal through the polysilicon gate and the thin gate oxide layer as that occurred in prior art may be prevented.

Another object of the present invention is to provide an improved gate contact structure by providing a contact metal resistant pads composed of thick oxide below the gate contact underneath the polysilicon gate wherein the contact metal resistant pads are formed with a simple step of forming these resistant pads during the process of patterning the field oxide whereby additional manufacture steps are not required in forming these contact metal resistant pads.

Another object of the present invention is to provide an improved gate contact structure by providing a contact metal resistant pads below the gate contact underneath the polysilicon layer wherein the pads occupies an area greater that the gate contact whereby the penetration of the contact metal through the gate and the oxide layer to contact the substrate is completely prevented.

Another object of the present invention is to provide an improved gate contact structure by providing a contact metal resistant pads below the gate contact underneath the polysilicon layer wherein the resistant pads, while larger than the gate contact, have a width smaller than or equal to the polysilicon layer and are completely covered under the polysilicon layer without extending beyond the area of the polysilicon whereby the thick oxide resistant pads would not unduly cause an early breakdown of the power device.

Briefly, in a preferred embodiment, the present invention includes a power transistor disposed on a substrate. The power device includes a core cell area comprising a plurality of power transistor cells each having drain and a source. Each of the power transistor cells further having a polycrystaline silicon gate formed on the substrate as part of a polycrystalline silicon gate layer overlaying the substrate. The polycrystalline silicon gate layer includes a plurality of polycrystaline gate-layer-extension extending to gate contact areas for forming gate contacts with a contact metal disposed thereon. The power transistor further includes a plurality of contact-metal-resistant pad each includes a thick oxide pad disposed below the gate contact areas underneath the polycrystaline gate layer extension whereby the contact-metal resistant pads resists the contact metal from penetrating therethrough and short to the substrate disposed thereunder.

In an alternate preferred embodiment, the present invention discloses a power transistor includes a core cell area comprising a plurality of power transistor cells having a gate formed thereon as a part of a gate layer which having a plurality of gate-layer-extension with contact areas for forming gate contacts with a contact metal thereon. The power transistor further includes contact-metal-resistant pads disposed below the gate contacts underneath the gate-layer extension for preventing the contact metal to penetrate therethrough. In a preferred embodiment, each of the contact-metal-resistant-pads having an area greater than an area of the contact metal above the gate-layer-extension whereby a penetration of the contact metals and short to the substrate can be completely prevented. In another preferred embodiment, each of the contact-metal-resistant-pads disposed on the substrate is substantially beneath the gate-layer extension without extending beyond an area covered by the gate-layer extension.

These and other objects and advantages of the present invention will no doubt become obvious to those of ordinary skill in the art after having read the following detailed description of the preferred embodiment which is illustrated in the various drawing figures.

DETAILED DESCRIPTION OF THE PREFERRED EMBODIMENT

Figure 1:
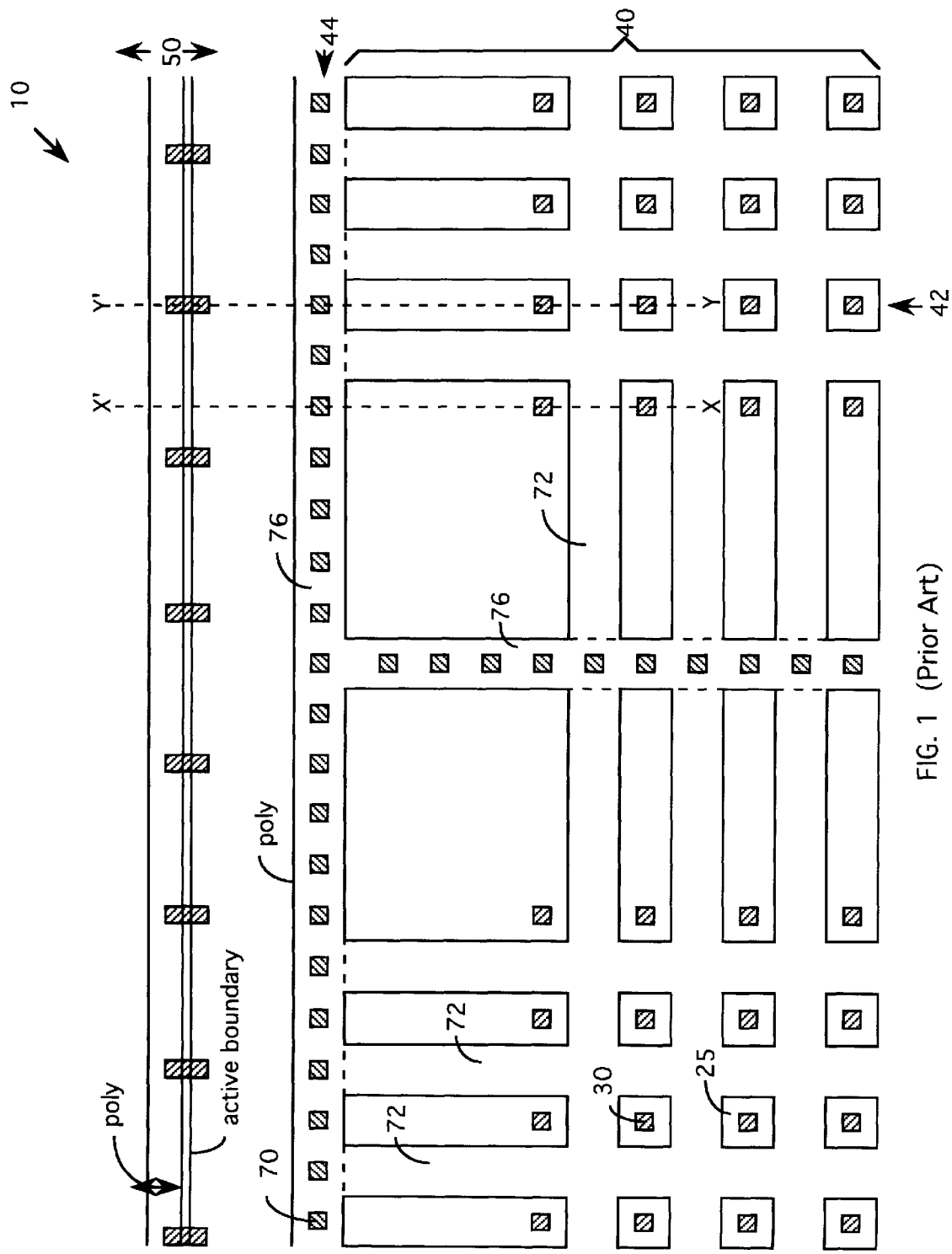
FIG. 1 is a top view of the prior art MOSFET device showing the active areas with polysilicon gate contact areas disposed therein and filed oxide areas opposite the active area.
Figure 2A:
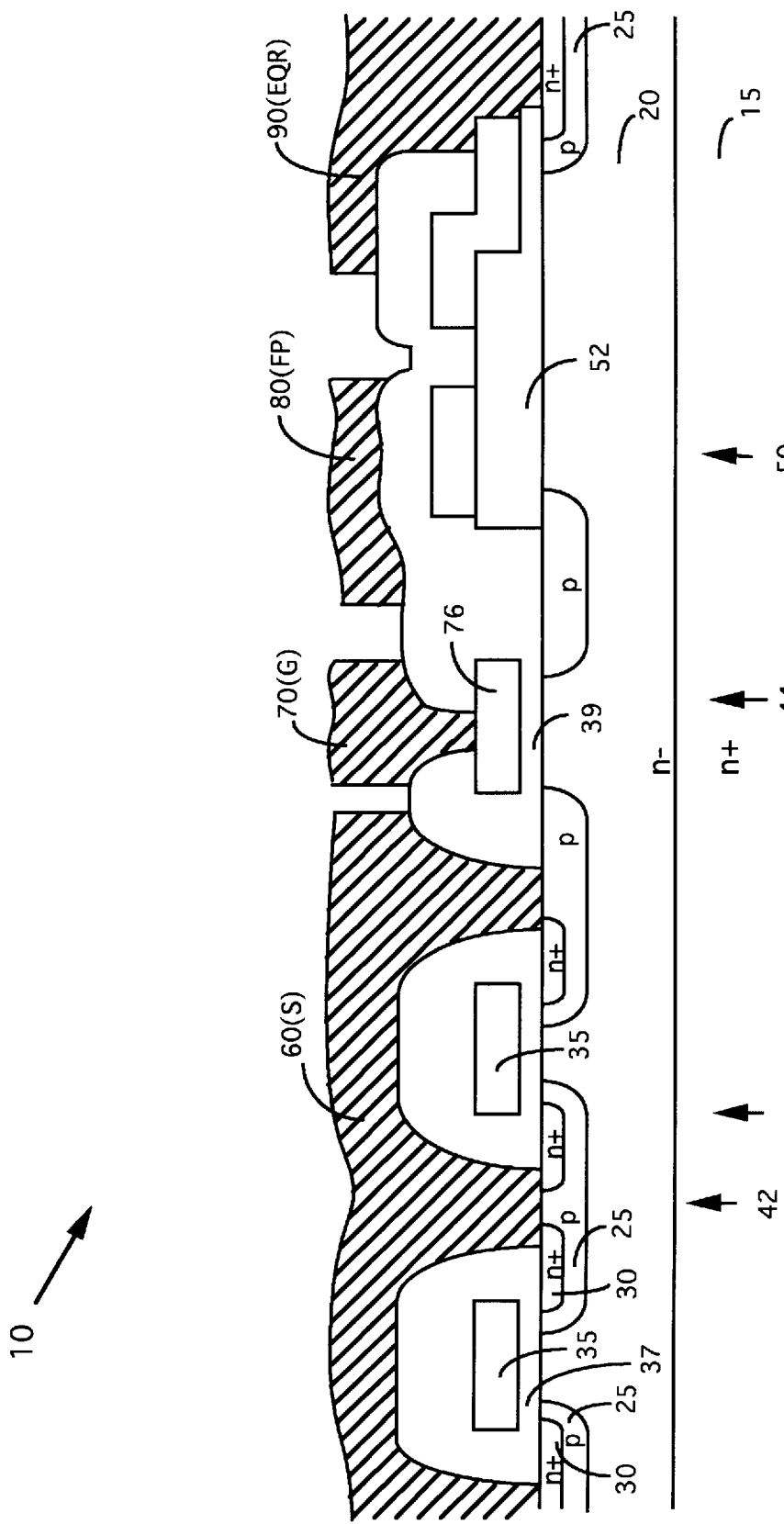
FIG. 2A is a cross-sectional view of a prior art gate contact structure for a general MOSFET device of FIG. 1.
Figure 2B:
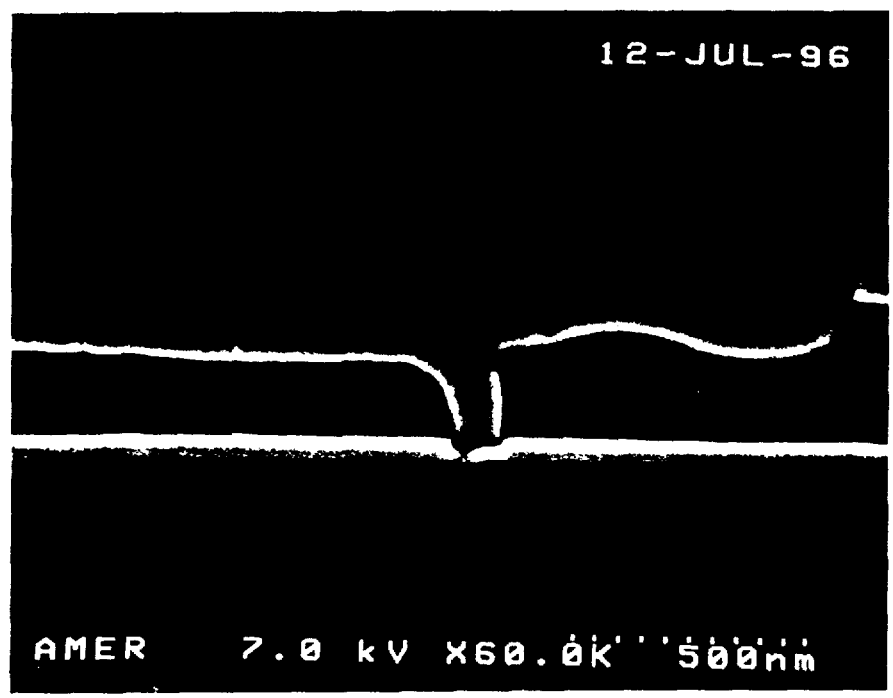
FIG. 2B is a cross-sectional view of a prior art gate contact structure showing the contact metal penetrating through the gate layer and the oxide layer for a general MOSFET device of FIG. 1.
Figure 3A:
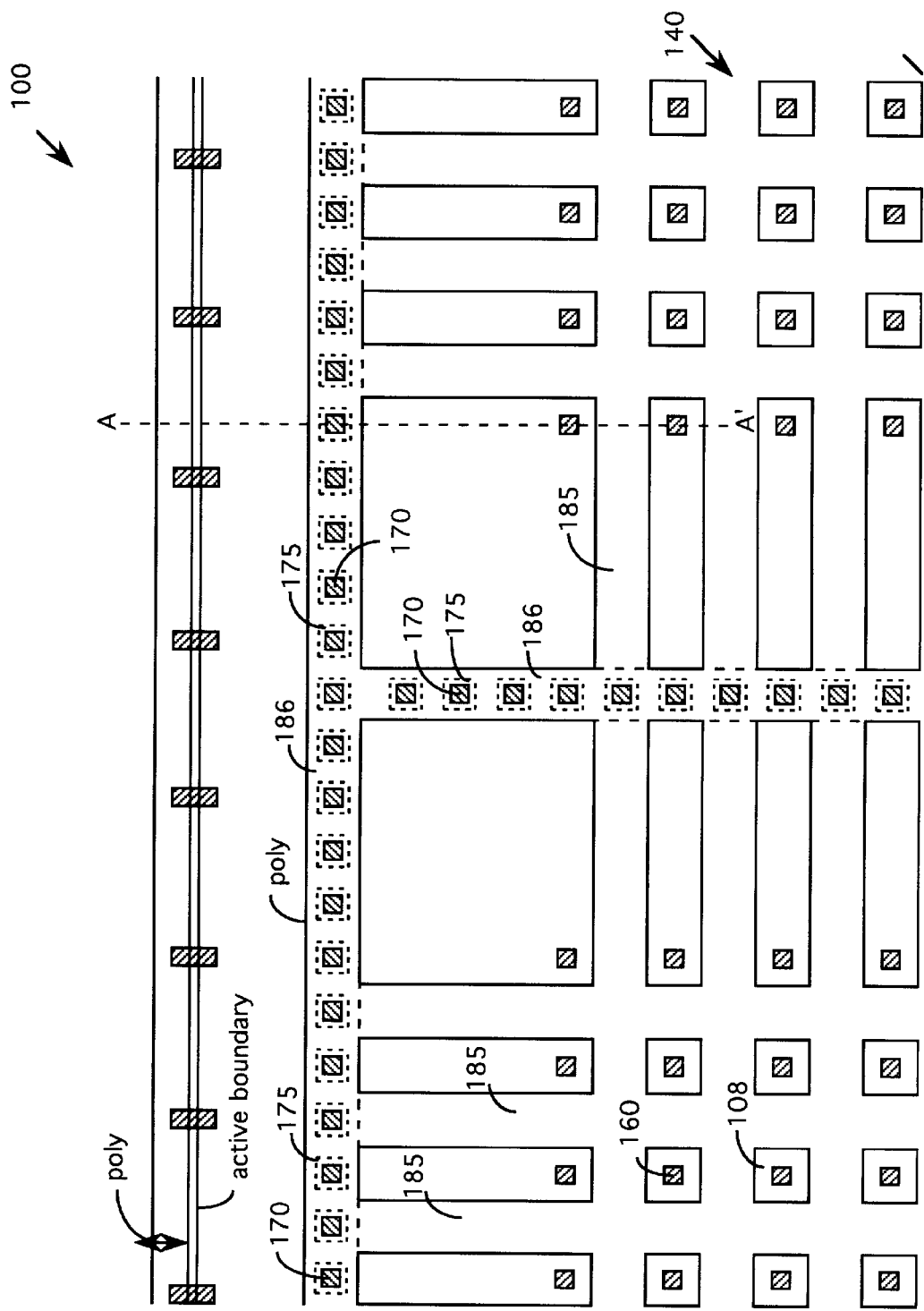
FIGS. 3A and 3B show a top view and cross sectional view of a semiconductor device with improved gate contact structure of this invention.
Figure 3B:
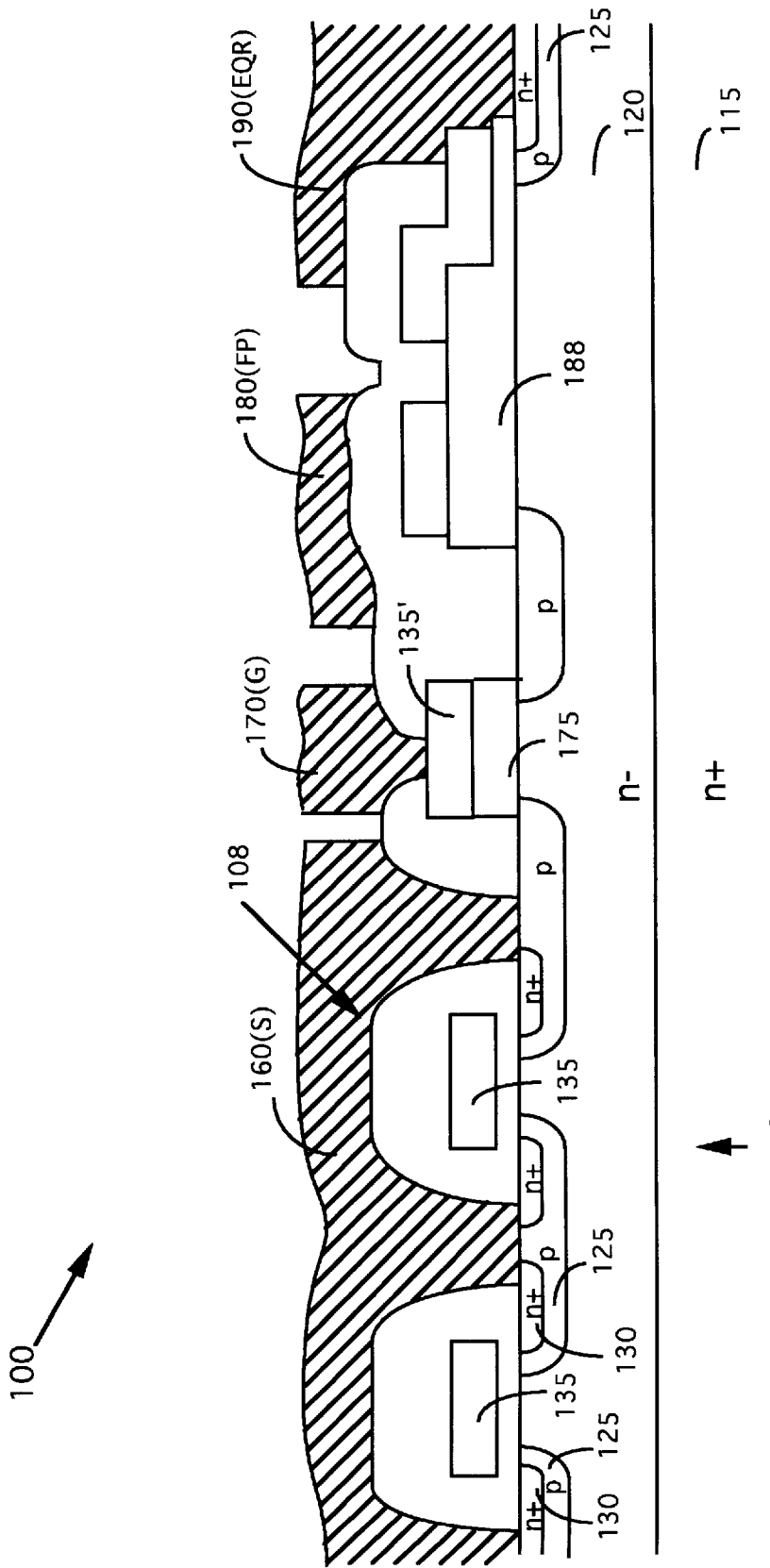

Please refer to FIGS. 3A to 3B respectively for a top view and a cross sectional view of a semiconductor power device 100 of the present invention. FIG. 3A shows a partial top view of the semiconductor power device 100 includes a core cell areas 140, which includes a plurality of transistor cells 108. The semiconductor power device 100 also includes a plurality of poly fingers 185 extended away from the core cell area 140. FIG. 3B shows the cross sectional view along A–A' line as that depicted in FIG. 3A. Please refer to FIG. 3B, the power semiconductor device 100 is supported on a n– doped layer 120 formed on a n$^+$ substrate 115. As a regular semiconductor power device each of the transistor cells 108, in the core cell area 140, includes a p-body 125 formed underneath a N$^+$ source region 130 with a gate 135 and a source contact 160 formed on the top surface as shown. The semiconductor power device 100 is provided with a novel gate contact structure to resolve the gate contact penetration problems. Specifically, the gate oxide layer, i.e., a contact metal resistant pad 175, under the polysilicon gate 135' which has a gate contact opening above the gate 135' for depositing the gate contact 170 therein, is specially configured to have the same thickness as that of a field oxide 188. Referring back to FIG. 3A, for a top view of the configuration relating to the novel gate structure. The gate contacts 170 which are disposed on gate runners 177 are protected by contact metal resistant pads 175 disposed underneath as that shown in a dotted line surrounding the gate contact 170.

The contact metal resistant pads 175 is configured to have an area which is greater than or equal to the gate contact 170 such that the penetration phenomena can be totally prevented. However, if the thick oxide layer, i.e., the contact metal resistant pads 175, underneath the polysilicon gate 135' extends beyond the polysilicon gate 135', an early breakdown problem may be induced. In order to prevent the degradation of the early breakdown voltage, the metal contact resistant pads 175 are specifically made to be smaller or equal to the width of the polysilicon gate 135' and the width of the resistant pads 175 should not greater than the width of either the gate runner 186 or the poly-fingers 185.

Figure 3C:
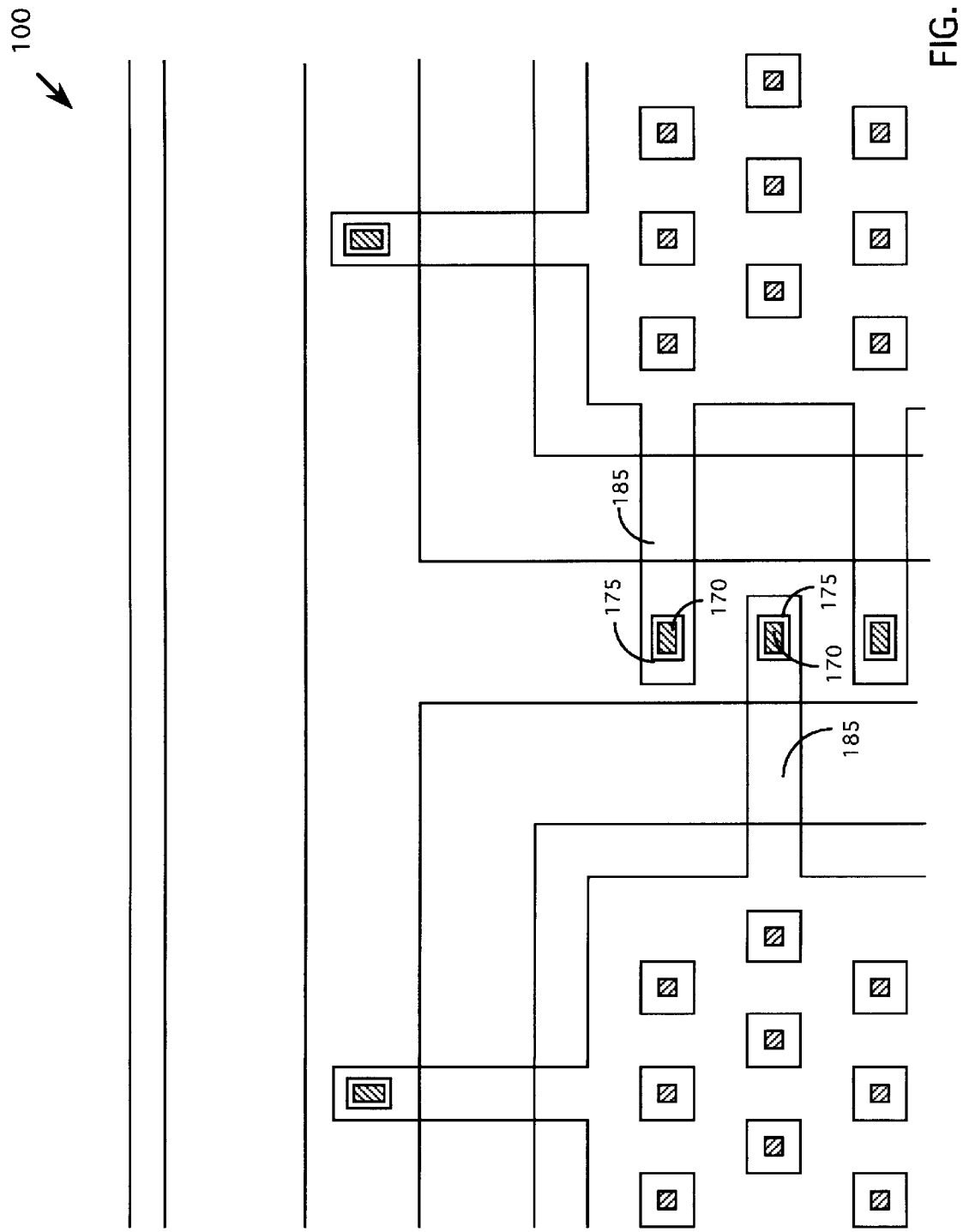
FIGS. 3C to 3E shows several top views of a semiconductor power device with gate contacts disposed on either on poly-fingers, gate runners, or on metal stripes.
Figure 3D:
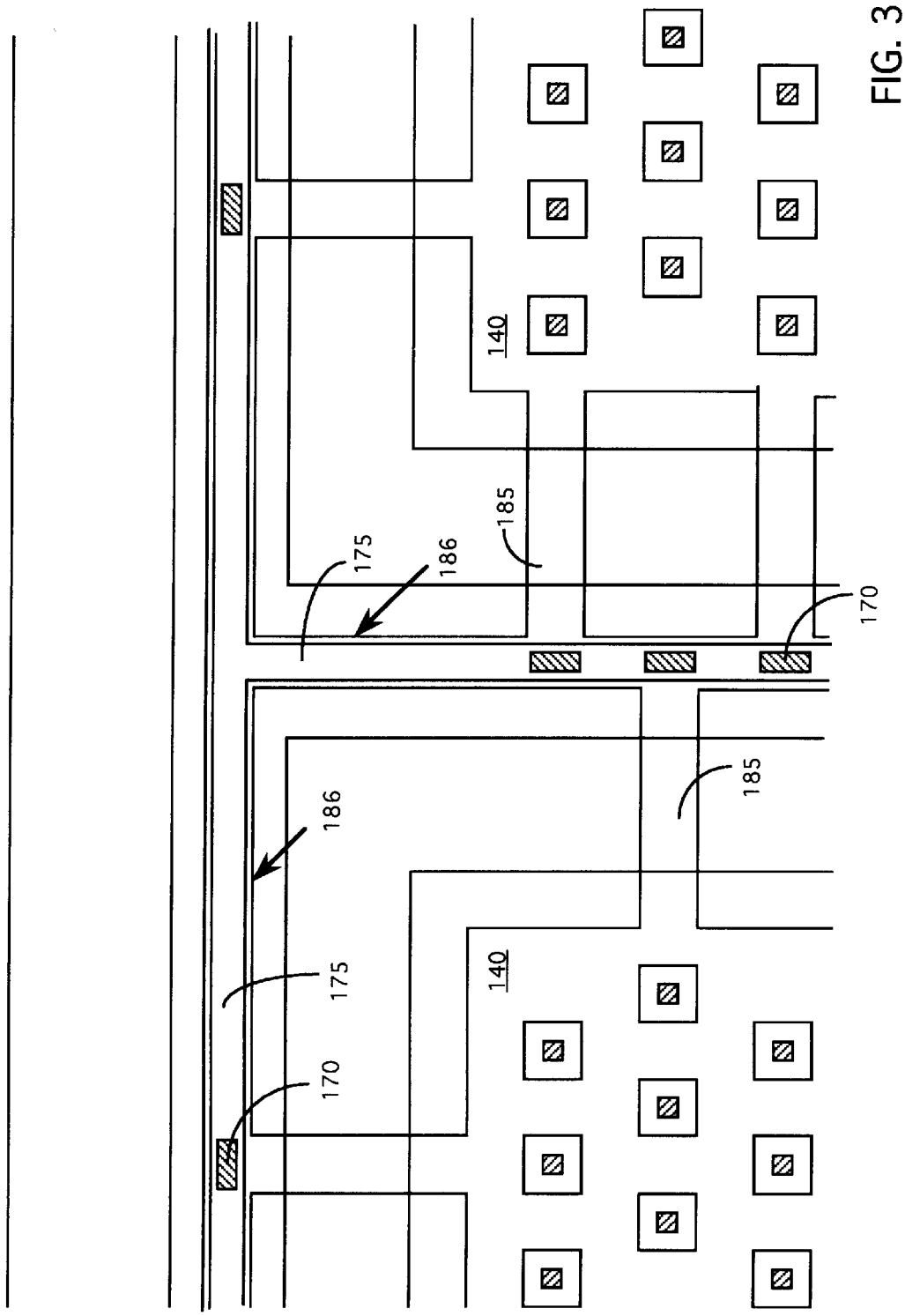
Figure 3E:
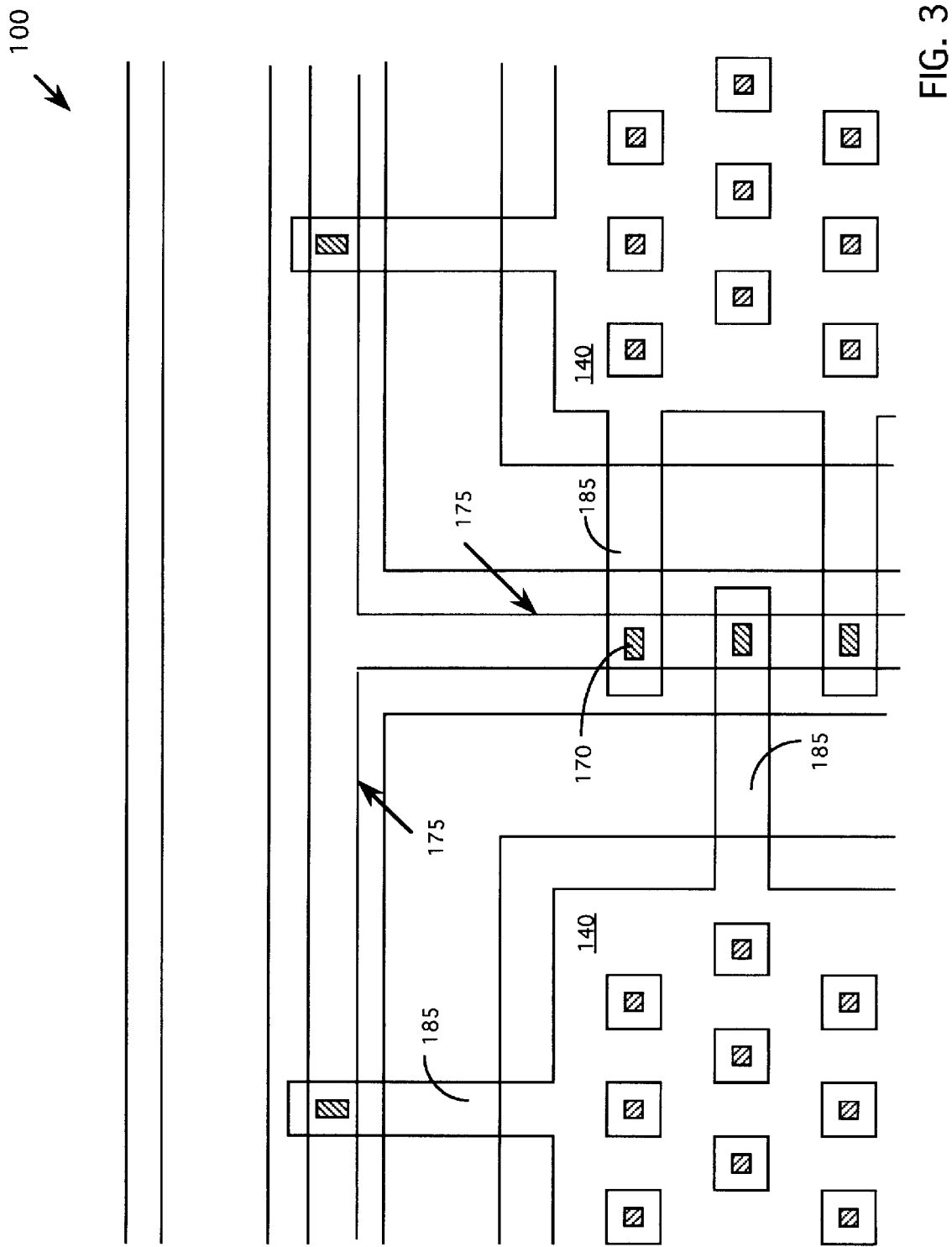

The gate metal resistant pads as disclosed in this invention may be implemented for various device configurations where the gate contacts can be disposed at different locations, and the shapes of the gate contacts may be arranged flexibly as that shown in FIGS. 3C to 3E. In FIG. 3C, the semiconductor power device 100 includes a plurality of ploy fingers 185. The gate runners are not employed in this device and the gate contacts 170 are formed right on the poly fingers. A gate metal resistant pad 175 is provided below each of the gate contact underneath the polycrystalline layer forming the poly fingers 185. The metal resistant pads 175 is larger than the gate contact 170 while the width of the resistant pads is narrower than the poly fingers 185. In FIG. 3D, the gate contacts 170 are disposed on a gate runner 186 and the metal resistant pads are formed as resistant stripes 175 underneath the gate runners 186. The width of the resistant stripes 175 is narrower than the gate runner 186 but wider than the width of the gate contact 170 for completely preventing the gate metal from penetrating through the gates. In FIG. 3E, the gate contacts 170 are again formed on the poly fingers 185. There is no gate runners to connect these poly fingers. The gate metal resistant pads are formed as resistant stripes 175 over the gate areas. The resistant stripes are running under each gate contact 170 below the polycrystalline silicon gate underneath the gate contact 170. Again, the width of the metal resistant stripes are wider than the gate contact 170 whereby the metal is prevented from forming a short circuit to the drain or the source by penetrating through the gates.

Figure 4:
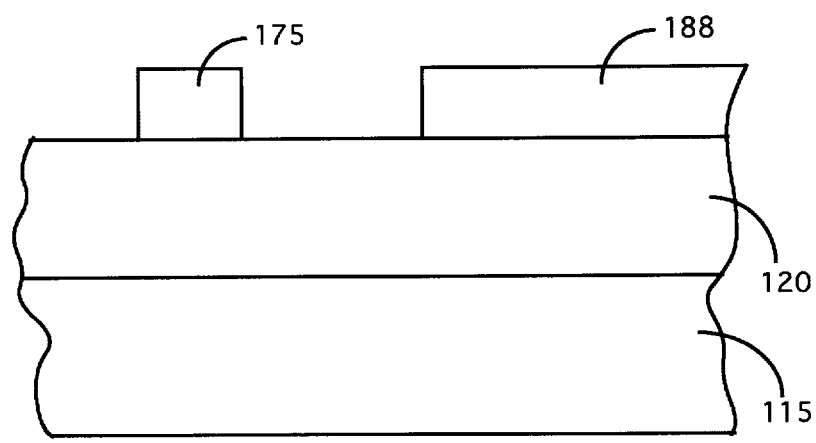
FIGS. 4 is cross sectional view for illustrating the manufacturing process of the semiconductor device with improved gate structure of the present invention.

The novel processing steps for manufacturing a semiconductor power device to achieve improved gate contact integrity according to the present invention are illustrated in FIG. 4. As shown in FIG. 4, the processing steps begins by first growing a N epitaxial layer 120 with a resistivity ranging from 0.1 to 1.0 ohm-cm on top of a N$^+$ substrate 115. The substrate has a resistivity of 0.001 to 0.007 ohm-cm. The thickness and the resistivity of the epitaxial layer 120 depend on the requirements for device on-resistance and breakdown voltage. In a preferred embodiment, the thickness of the epi-layer 120 is about six to eight microns (6–8 $\mu$m). An initial field oxide layer 188 of thickness in the range of 3,000 to 10,000 Å is grown which is then etched by applying an active mask to define the active areas 140.

According to a novel feature of the present invention, the active mask is specially configured such that the field oxide layer 188 is etched away in the active area 140 while keeping a plurality of contact metal resistant pads 175 intact. The contact metal resistant pads 175 have a same thickness as that shown in FIGS. 3B and 4. Other than this novel step of keeping a plurality of non-etched areas 175 as the contact metal resistant pads, the remaining steps of manufacturing are well known and commonly practiced. For the sake of simplicity and clarity, the remaining steps of manufacturing the semiconductor device is not further described because these steps are not essential to the main thrust of this invention.

It is to be noted again that the areas of the contact metal resistant 175, which is specially configured according to a active mask in etching the field oxide layer, are kept to be greater than the areas of the metal gate contact 170 and smaller than the polysilicon gate 135' to be formed next on top of the resistant pads 175. Therefore, in the subsequent processing steps, the masks, i.e., the poly-mask and the contact mask have to be configured with certain shape and dimension such that the novel gate structure as that disclosed in this invention can be implemented. Since the applications of different mask to form circuit elements on a semiconductor chips with precise shapes and locations are also commonly practiced among those of ordinary skill in the art. Detail description of these steps would not be necessary.

In summary, this invention discloses a power transistor 100 includes a core cell area 140 comprising a plurality of power transistor cells 108 having a gate 135 formed thereon as a part of a gate layer which having a plurality of gate-layer-extension which may include either the poly-fingers 185 and the gate runner 186 with contact areas for forming gate contacts 170 with a contact metal thereon. The power transistor 100 further includes contact-metal-resistant pads 175 disposed below the gate contacts 170 underneath the gate-layer extension 135' for preventing the contact metal 170 to penetrate therethrough. In a preferred embodiment, each of the contact-metal-resistant-pads 175 having an area greater than an area of the contact metal 170 above the gate-layer-extension 135' whereby a penetration of the contact metals 170 and short to the substrate 120 can be completely prevented. In another preferred embodiment, each of the contact-metal-resistant-pads 175 disposed on the substrate 125 is substantially beneath the gate-layer extension 135' without extending beyond an area covered by the gate-layer extension 135'.

This invention also discloses a method for manufacturing a power transistor on a substrate. The method includes the steps of depositing a field oxide layer 188 on a top surface of the substrate 120. The method further includes a step of etching away the field oxide 188 to define an active area 140 for manufacturing a plurality of transistor cells 108 thereon and to define a plurality of metal contact resistant pads 175 by keeping the field oxide 188 in a plurality of gate contact areas for subsequently forming a gate layer 135' and a gate contact 170 thereon.

Therefore, the present invention provides an improved gate contact structure manufactured by a novel process in order to overcome the limitations and difficulties encountered in the prior art. Specifically, an improved gate contact structure is disclosed wherein a special contact metal resistant pads composed of thick oxide layer is formed below the gate contact underneath the polysilicon gates such that penetration of the gate metal through the polysilicon gate and the thin gate oxide layer as that occurred in prior art may be prevented. Furthermore, contact metal resistant pads are formed with a simple step of forming these resistant pads during the process of patterning the field oxide whereby additional manufacture steps are not required in forming these contact metal resistant pads. Additionally, the pads occupies an area greater that the gate contact whereby the penetration of the contact metal through the gate and the oxide layer to contact the substrate is completely prevented. Finally, the resistant pads, while larger than the gate contact, have a width smaller than or equal to the polysilicon layer and are completely covered under the polysilicon layer without extending beyond the area of the polysilicon whereby the thick oxide resistant pads would not unduly cause an early breakdown of the power device.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

We claim:

1. A power transistor disposed on a substrate comprising:

a core cell area comprising a plurality of power transistor cells each having drain and a source;

each of said power transistor cells further having a polycrystalline silicon gate formed on said substrate as part of a polycrystalline silicon gate layer overlaying said substrate;

said polycrystalline silicon gate layer includes a plurality of polycrystaline gate-layer-extensions extending to gate contact areas provided for forming gate contact windows opened in an insulation layer overlaying said gate-layer-extensions with a gate-metal disposed in said gate contact windows;

a gate-metal-resistant pad includes a thick oxide pad disposed directly on a top surface of said substrate below each and every one of said gate contact windows underneath said polycrystalline gate layer extensions whereby said gate-metal resistant pads completely preventing said gate-metal disposed in each of said gate contact windows from penetrating through said polycrystalline gate layer and short to the substrate disposed thereunder.

2. The power transistor of claim 1 wherein:

said polycrystalline silicon gate-layer-extension includes a plurality of polycrystalline silicon fingers extending from said core cell areas provided for forming said gate contact windows to depose said gate-metal therein.

3. The power transistor of claim 2 wherein:

said polycrystalline silicon gate-layer-extension includes a plurality of gate runners interconnecting several said polycrystalline silicon fingers for electrically connecting to said gate-metal.

4. The power transistor of claim 1 wherein:

each of said gate-metal-resistant-pads having an area greater than an area of said gate-metal to be disposed in each of said gate contact windows above said gate-layer-extension whereby a penetration of said gate-metal through said polycrystalline silicon layer and short to said substrate are completely prevented.

5. The power transistor of claim 3 wherein:

each of said gate-metal-resistant-pads disposed on said substrate beneath said gate-layer-extension without extending beyond an area covered by said polycrystalline silicon fingers or said gate runners.

6. A transistor includes a core cell area comprising a plurality of transistor cells having a gate formed thereon as a part of a gate layer which having a plurality of gate-layer-extensions with contact areas provided for forming gate contact windows to dispose a gate-metal therein, said transistor further comprising:

gate-metal-resistant-pads disposed below each and every one of said gate contact windows underneath said gate-layer-extension for completely preventing said gate-metal, to be disposed in said gate contact windows, to penetrate through said gate-layer-extension and short to the substrate.

7. The transistor of claim 6 wherein:

each of said gate-metal-resistant-pads having an area greater than an area of said gate-metal provided for disposing in said gate contact windows above said gate-layer-extension whereby a penetration of said gate-metal through said gate-layer-extension and short to said substrate can be completely prevented.

8. The transistor of claim 6 wherein:

each of said gate-metal-resistant-pads disposed on said substrate is beneath said gate-layer-extension without extending beyond an area covered by said gate-layer extension.

* * * * *